(12) United States Patent
Onodera

(10) Patent No.: US 9,312,252 B2
(45) Date of Patent: Apr. 12, 2016

(54) METHOD OF MANUFACTURING A SEMICONDUCTOR DEVICE HAVING A CHIP MOUNTED ON AN INTERPOSER

(71) Applicant: SPANSION LLC, Sunnyvale, CA (US)

(72) Inventor: Masanori Onodera, Tokyo (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/271,115

(22) Filed: May 6, 2014

(65) Prior Publication Data

US 2014/0256088 A1 Sep. 11, 2014

Related U.S. Application Data

(62) Division of application No. 12/196,156, filed on Aug. 21, 2008, now Pat. No. 8,749,039.

(30) Foreign Application Priority Data

Aug. 21, 2007 (JP) ................................ 2007-215190

(51) Int. Cl.
*H01L 25/00* (2006.01)
*H01L 21/56* (2006.01)
(Continued)

(52) U.S. Cl.
CPC ............... *H01L 25/50* (2013.01); *H01L 21/56* (2013.01); *H01L 21/563* (2013.01); *H01L 23/3128* (2013.01); *H01L 23/3135* (2013.01); *H01L 25/03* (2013.01); *H01L 25/105* (2013.01); *H01L 24/16* (2013.01); *H01L 24/29* (2013.01); *H01L 24/48* (2013.01); *H01L 25/0655* (2013.01); *H01L 2224/16225* (2013.01);

(Continued)

(58) Field of Classification Search
None
See application file for complete search history.

(56) References Cited

U.S. PATENT DOCUMENTS 5,786,273 A 7/1998 Hibi et al.
6,403,431 B1 6/2002 Chung et al.
(Continued)

FOREIGN PATENT DOCUMENTS

JP 2000294723 10/2000
JP 2001320014 11/2001
(Continued)

OTHER PUBLICATIONS

USPTO Final Rejection for U.S. Appl. No. 12/196,156 dated Oct. 30, 2013; 14 pages.

(Continued)

*Primary Examiner* — Michael Jung

(57) ABSTRACT

A semiconductor device 100 includes: a first semiconductor package 10; a first interposer 12 having an upper surface on which the first semiconductor package 10 is mounted; a first molding resin 14 that is provided on the upper surface of the first interposer 12 and seals the first semiconductor package 10; a second semiconductor package 20 mounted on an upper surface of the first molding resin 14; a second interposer 22 on which the second semiconductor package 20 is mounted by flip chip bonding; and a second molding resin 40 that is provided on the upper surface of the first interposer 12 and seals the first molding resin 14, the second semiconductor package 20, and the second interposer 22. The second semiconductor package 20 is mounted, with a surface thereof opposite to another surface mounted on the second interposer 22 faced down, on the upper surface of the first molding resin 14 via an adhesive 30.

5 Claims, 11 Drawing Sheets

(51) Int. Cl.
  H01L 23/31 (2006.01)
  H01L 25/03 (2006.01)
  H01L 25/10 (2006.01)
  H01L 23/02 (2006.01)
  H01L 23/00 (2006.01)
  H01L 25/065 (2006.01)

(52) U.S. Cl.
  CPC ............... *H01L 2224/32225* (2013.01); *H01L 2224/48091* (2013.01); *H01L 2224/48225* (2013.01); *H01L 2224/48227* (2013.01); *H01L 2224/73203* (2013.01); *H01L 2224/73204* (2013.01); *H01L 2224/73253* (2013.01); *H01L 2224/73265* (2013.01); *H01L 2225/1023* (2013.01); *H01L 2225/1052* (2013.01); *H01L 2924/01079* (2013.01); *H01L 2924/078* (2013.01); *H01L 2924/15311* (2013.01); *H01L 2924/19107* (2013.01)

(56) References Cited

U.S. PATENT DOCUMENTS

| | | |
|---|---|---|
| 6,544,883 B2 | 4/2003 | Ohuchi |
| 6,864,173 B2 | 3/2005 | Kim |
| 7,061,088 B2 | 6/2006 | Karnezos |
| 7,745,918 B1 | 6/2010 | Woodyard |
| 2002/0022360 A1 | 2/2002 | Kim et al. |
| 2003/0040152 A1 | 2/2003 | Liu et al. |
| 2004/0113253 A1* | 6/2004 | Karnezos ............... 257/686 |
| 2007/0045876 A1 | 3/2007 | Onodera et al. |
| 2008/0042251 A1* | 2/2008 | Weng et al. ............ 257/686 |
| 2009/0174051 A1* | 7/2009 | Osaka et al. ........... 257/686 |
| 2009/0236718 A1* | 9/2009 | Yang et al. ............ 257/686 |

FOREIGN PATENT DOCUMENTS

| | | |
|---|---|---|
| JP | 2002093937 | 3/2002 |
| JP | 2004303992 | 10/2004 |
| JP | 2006216975 | 8/2006 |
| JP | 2007013155 | 1/2007 |
| JP | 2007175855 | 7/2007 |
| WO | 03071606 | 8/2003 |
| WO | 2006106569 | 10/2006 |

OTHER PUBLICATIONS

USPTO Non-Final Rejection for U.S. Appl. No. 12/196,156 dated Dec. 14, 2010; 8 pages.
USPTO Notice of Allowance for U.S. Appl. No. 12/196,156 dated Jan. 27, 2014; 9 pages.
USPTO Notice of Allowance for U.S. Appl. No. 12/196,156 dated May 1, 2014; 4 pages.

* cited by examiner

METHOD OF MANUFACTURING A SEMICONDUCTOR DEVICE HAVING A CHIP MOUNTED ON AN INTERPOSER

CROSS-REFERENCES TO RELATED APPLICATIONS

This application is a divisional of U.S. patent application Ser. No. 12/196,156 filed on Aug. 21, 2008, entitled "Semiconductor Device Having Chip Mounted on an Interposer," which claims priority from Japanese Patent Application 2007-215190 filed on Aug. 21, 2007, which are hereby incorporated herein by reference in their entirety.

TECHNICAL FIELD

The present invention relates to a semiconductor device of a multi-chip package type in which a second semiconductor package is placed on a first semiconductor package.

BACKGROUND ART

Recently, in accordance with miniaturization and high functionalization of electronic equipment, a number of semiconductor devices having high mounting density of semiconductor chips have been developed. As a method for increasing mounting density of semiconductor chips, semiconductor devices of a so-called multi-chip package type in which a second semiconductor package is deposited on a first semiconductor package has been developed. This is also known as package on package configuration. In such semiconductor devices, since a plurality of semiconductor packages are mounted in a stacked manner in a vertical direction, the mounting density of semiconductor devices can be increased. Further, since only pre-tested semiconductor chips are selected and mounted, the manufacturing yield of semiconductor devices is improved.

Japanese Unexamined Patent Application Publication (Translation of PCT Application) No. JP-T-2006-502596 discloses a number of such semiconductor devices of a multi-chip package type.

In related-art semiconductor devices of a multi-chip package type, since resin-sealed packages are stacked, low-profiling of semiconductor devices is difficult.

SUMMARY OF THE INVENTION

In order to solve the problems described above, it is an object of the present invention to realize low-profiling of a semiconductor device of a multi-chip package type. Another object is to improve reliability of a semiconductor device of a multi-chip package type.

According to an aspect of the present invention, a semiconductor device includes, a first interposer having an upper surface on which a first semiconductor package is mounted. A first molding resin is provided on the upper surface of the first interposer, which seals the first semiconductor package. A second semiconductor package is mounted on an upper surface of the first molding resin. A second interposer is used to mount the second semiconductor by flip chip bonding. A second molding resin, provided on the upper surface of the first interposer, seals the first molding resin, the second semiconductor chip, and the second interposer.

DETAILED DESCRIPTION

Figure 1:
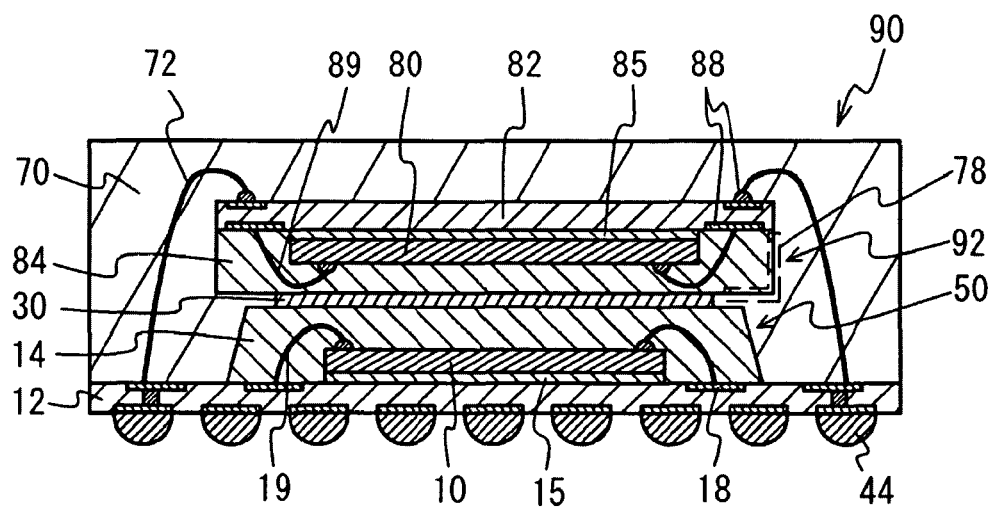
FIG. 1 is a cross-sectional view of a related-art semiconductor device.

FIG. 1 shows a structure of a semiconductor device 90 of a multi-chip package type. On a first semiconductor package 50, a second semiconductor package 92 is mounted via an adhesive 30.

A structure of the first semiconductor package 50 is as the following. On an upper surface of a first interposer 12, a first semiconductor chip 10 is mounted via a first die adhesive 15. The first semiconductor chip 10 is electrically coupled to a first substrate electrode 18 provided on the upper surface of the first interposer 12 by a first wire 19. The first semiconductor chip 10 and the first wire 19 are sealed with a first molding resin 14 provided on the upper surface of the first interposer 12.

A structure of the second semiconductor package 92 is shown. A second semiconductor chip 80 is mounted on a second interposer 82 via a second die adhesive 85. The second semiconductor chip 80 is electrically coupled to a second substrate electrode 88 provided on the second interposer 82 by a second wire 89. The second semiconductor chip 80 and the second wire 89 are sealed with a second molding resin 84.

The first semiconductor package 50 and the second semiconductor package 92 are electrically coupled to each other by a third wire 72 that couples the first substrate electrode 18 and the second substrate electrode 88. On the upper surface of the first interposer 12, a third molding resin 70 that seals the first semiconductor package 50 and the second semiconductor package 92 is provided. On a lower surface of the first interposer 12, an external coupling terminal 44 is provided.

In semiconductor device 90 of a multi-chip package type, on the first semiconductor package 50 that is sealed with a resin, the second semiconductor package 92 that is also sealed with a resin is mounted in a stacked manner. As for the second semiconductor package 92, the second semiconductor chip 80 is electrically coupled to the second interposer 82 by wire bonding. As described above, since the second semiconductor package 92 includes the second wire 89 and the second molding adhesive 84, low-profiling of the second semiconductor package 92 is limited. Therefore, low-profiling of the whole semiconductor device 90 is difficult.

Also, since the second molding resin 84 and the third molding resin 70 are both made of a resin, adhesiveness is not good. Therefore, peeling occurs in a boundary surface 78, and structural reliability of the semiconductor device 90 is degraded.

In order to solve the problems described above, it is an object of the present invention to realize low-profiling of a semiconductor device of a multi-chip package type. Another object is to improve reliability of a semiconductor device of a multi-chip package type.

With reference to the drawings, embodiments of the present invention will be described below.

Figure 2A:
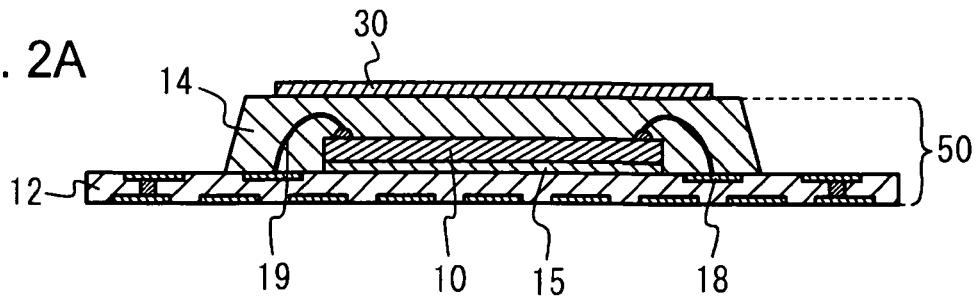
FIG. 2A to FIG. 2D show a method for manufacturing a semiconductor device according to a first embodiment of the present invention.

With reference to FIG. 2A, on an upper surface of the first semiconductor package 50 on which the first semiconductor chip 10 is mounted, the adhesive 30 made of, for example, a silicone based resin is provided. A structure of the first semiconductor package 50 is the same as that shown in FIG. 1. The first semiconductor chip 10 made of, for example, a silicon is mounted on the upper surface of the first interposer 12 made of, for example, a polyimide based resin, and is sealed with the first molding resin 14 made of, for example, an epoxy based resin. The adhesive 30 is provided on an upper surface of the first molding resin 14. For the adhesive 30, although other resins such as an insulating epoxy based resin and an acrylic based resin can be used, it is preferable to use a silicone based resin having high thermal conductivity.

With reference to FIG. 2A to FIG. 2D, a method for manufacturing a semiconductor device 100 according to a first embodiment of the present invention is described in detail. Note that the same reference numerals are used for the same structures as those in the related-art semiconductor device (FIG. 1), and their explanations are omitted.

Figure 2B:
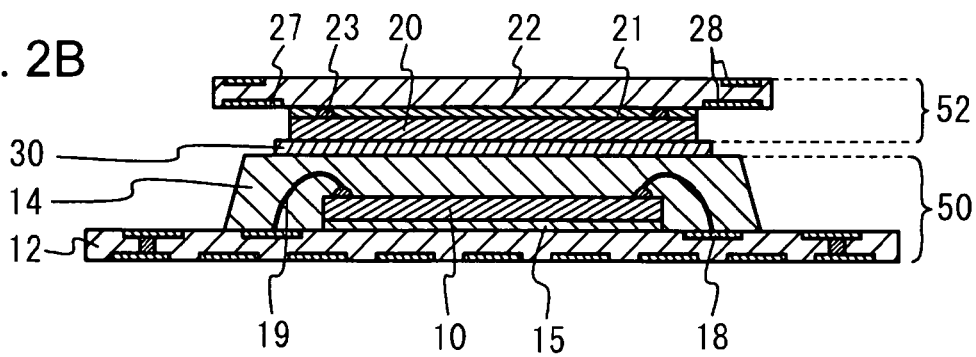

With reference to FIG. 2B, on the upper surface of the first molding resin 14 of the first semiconductor package 50, a second semiconductor package 52 is mounted via the adhesive 30. A structure of the second semiconductor package 52 differs from that of the related-art second semiconductor package 92 shown in FIG. 1. As for the second semiconductor package 52, the second semiconductor chip 20 is mounted on the second interposer 22 by flip-chip bonding. The second semiconductor chip 20 and the second interposer 22 are electrically coupled to each other by a bump electrode 23 made of, for example, gold. An area between the second semiconductor chip 20 and the second interposer 22 is filled with an underfill material 21 made of, for example, an epoxy based resin. On the second interposer 22, substrate electrodes 28 for electrically coupling with the outside are provided. The substrate electrodes 28 are made of, for example, copper, and a part of such electrodes serves as a testing electrode 27 that is used when performing electrical tests of the second semiconductor package. The second semiconductor package 52 is mounted on the upper surface of the first molding resin 14 by facing down a surface, of the second semiconductor chip 20, opposite to another surface mounted on the second interposer 22.

Figure 2C:
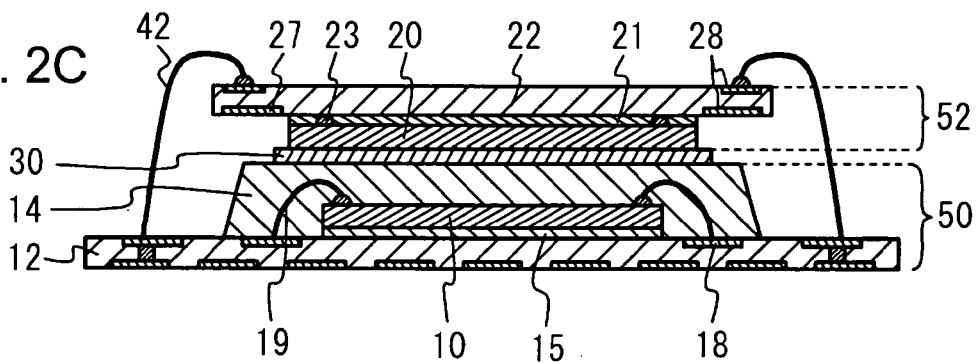

With reference to FIG. 2C, the first substrate electrode 18 and the second substrate electrode 28 are coupled to each other by a second wire 42 made of, for example, gold. Therefore, the first semiconductor package 50 and the second semiconductor package 52 are electrically coupled to each other.

Figure 2D:
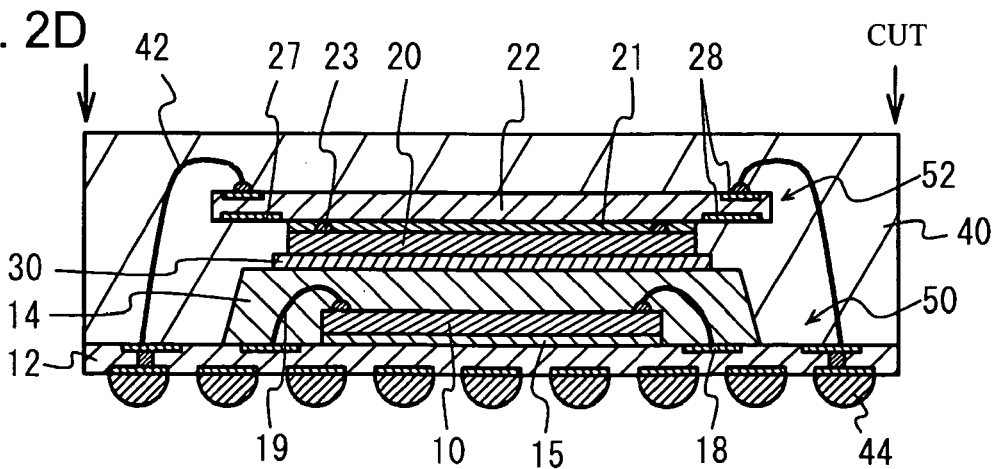

With reference to FIG. 2D, on the upper surface of the first interposer 12, a second molding resin 40 that seals the first semiconductor package 50 and the second semiconductor package 52 is formed. The second molding resin 40 is made of, for example, an insulating epoxy based resin, and is formed so as to seal at least the first molding resin 14, the second semiconductor chip 20, and the second interposer 22. A surface of an electrode pad made of for example, copper provided on the lower surface of the first interposer 12 is provided with a solder ball made of, for example, a tin-silver based solder, and the external coupling terminal 44 is formed thereto. Further, the first interposer 12 and the second molding resin 40 are cut at a predetermined position by, for example, a dicing device. As a result of the above processes, the semiconductor device 100 according to the first embodiment is completed.

Figure 3:
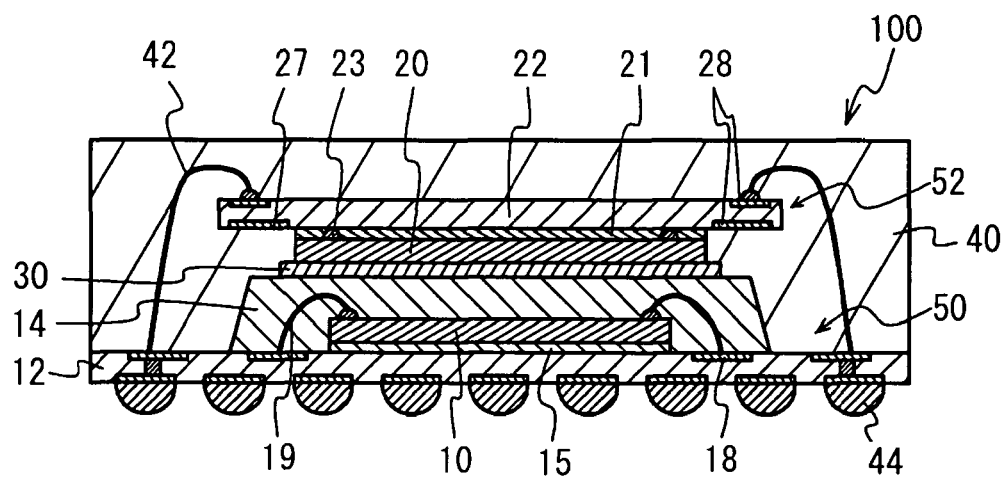
FIG. 3 is a cross-sectional view of the semiconductor device according to the first embodiment.

FIG. 3 shows a structure of the semiconductor device 100 according to the first embodiment. The first semiconductor chip 10 is mounted on the upper surface of the first interposer 12 via the first die adhesive 15. The first semiconductor chip 10 is electrically coupled to the first substrate electrode 18 provided on the upper surface of the first interposer 12 by the first wire 19. The first semiconductor chip 10 and the first wire 19 are sealed with the first molding resin 14 provided on the upper surface of the first interposer 12.

The second semiconductor chip 20 is mounted on the second interposer 22 by flip-chip bonding. The second semiconductor chip 20 and the second interposer 22 are electrically coupled to each other by the bump electrode 23. The area between the second semiconductor chip 20 and the second interposer 22 is filled with the underfill material 21. On the second interposer 22, the substrate electrodes 28 for electrically coupling with the outside are provided, and a part of such electrodes serves as the testing electrode 27 that is used when performing electrical tests of the second semiconductor package.

The second semiconductor chip 20 is mounted, with a surface thereof opposite to another surface mounted on the second interposer 22 faced down, on the upper surface of the first molding resin 14 via the adhesive 30. On the upper surface of the first interposer 12, the second molding resin 40 that seals the first molding resin 14, the second semiconductor chip 20, and the second interposer 22 is provided. Further, the first substrate electrode 18 and the second substrate electrode 28 are electrically coupled to each other by the second wire 42. On the lower surface of the first interposer 12, the external coupling terminal 44 that is electrically coupled to the first substrate electrode 18 is provided.

The semiconductor device 100 according to the first embodiment has the second semiconductor package 52 that is not sealed with a resin and is mounted in a stacked manner on the first semiconductor package 50 that is sealed with a resin. The second semiconductor package 52 has the second semiconductor chip 20 mounted on the second interposer 22 by flip-chip bonding. Therefore, compared to a related-art semiconductor device of a multi-chip package type, the semiconductor package to be mounted on an upper side can be made thin as much as the molding resin and the wire (equivalent to the second molding resin 84 and the second wire 89 in FIG. 1). Accordingly, an increase in package thickness due to the molding resin and the wire is minimized, and low-profiling of the whole semiconductor device can be realized.

With reference to FIG. 2B through 2D, after mounting the second semiconductor package 52 that is not sealed with a resin on the first semiconductor package 50, the overall package is sealed with the second molding resin 40. Therefore, peeling of molding resins in the boundary surface 78 as shown in FIG. 1 does not occur, and adhesiveness of the second semiconductor package 52 and the second molding resin 40 is improved. As a result, reliability of the semiconductor device can be improved.

With reference to FIG. 1, in the semiconductor device 90, since the second semiconductor package 92 is sealed with a resin, a position to provide a testing electrode is limited to one surface (opposite to another surface that is sealed with a resin) of the second interposer 82. As for the semiconductor device 100 according to the first embodiment, since the second semiconductor package 52 that is not sealed with a resin is used, the testing electrode 27 can be provided on any surface of the second interposer 22. For example, as shown in FIG. 3, the testing electrode 27 can be provided on the same surface, of the second interposer 22, as the surface on which the second semiconductor chip 20 is mounted. Accordingly, selectivity of a position to provide the testing electrode 27 becomes high, and the degree of freedom in design can be increased. Also, by increasing the degree of freedom in design, it is possible to take measures to prevent contamination of the second substrate electrode 28 and breakage of the second semiconductor chip 20.

Second Embodiment

A second embodiment of the present invention is an example of filling an area between a first molding resin and a second interposer with a supporting member. With reference to FIG. 4A to FIG. 4D, a method for manufacturing a semiconductor device 101 according to the second embodiment will be explained. Note that the same reference numerals are used for the same structures as those in the method for manufacturing the semiconductor device 100 according to the first embodiment (FIG. 2A to FIG. 2D), and their explanations are omitted.

Figure 4A:
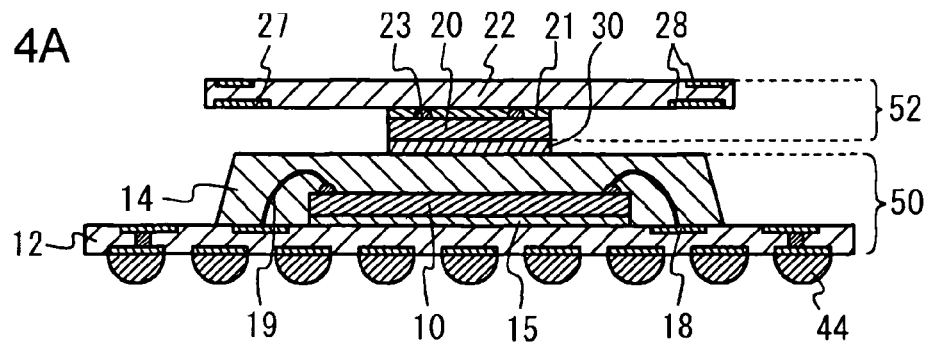
FIG. 4A to FIG. 4D show a method for manufacturing a semiconductor device according to a second embodiment of the present invention.

With reference to FIG. 4A, on the upper surface of the first molding resin 14 of the first semiconductor package 50, the second semiconductor chip 20 of the second semiconductor package 52 is mounted via the adhesive 30. As shown in the drawing, the length of the second semiconductor chip 20 in a lateral direction is shorter than that of the upper surface of the first molding resin 14 and the second interposer 22 in a lateral direction. More specifically, the second semiconductor chip 20 is small compared to the first molding resin 14 and the second interposer 22. Further, the second semiconductor chip 20 is mounted on the second interposer 22 by flip-chip bonding, and a space is left between the first molding resin 14 and the second interposer 22.

Figure 4B:
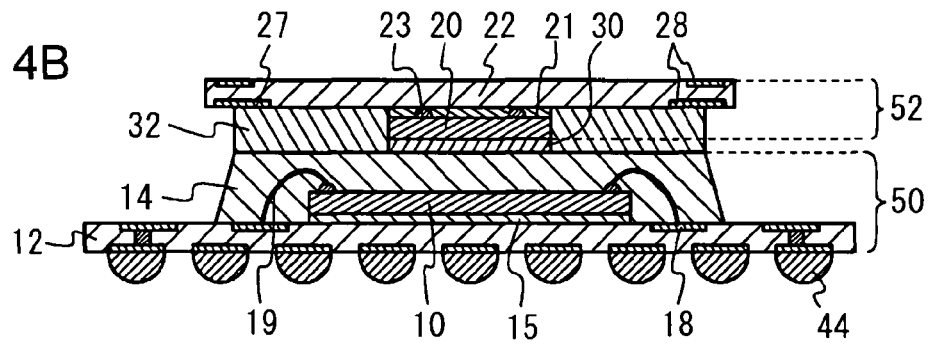

With reference to FIG. 4B, the area between the first molding resin 14 and the second interposer 22 is filled with a supporting member 32. For the supporting member 32, although an insulating epoxy based resin, an acrylic based resin, a silicone based resin or the like may be used, it is preferable to use a silicone based resin having high thermal conductivity. Further, it is preferable to use a resin of a semi-liquid state that is easy in filling. Although it is enough to fill the area with the supporting member 32 so as to cover at least side surfaces of the second semiconductor chip 20, it is preferable to fill the area between the first molding resin 14 and the second interposer 22 thoroughly with the supporting member 32 as shown in FIG. 4B.

Figure 4C:
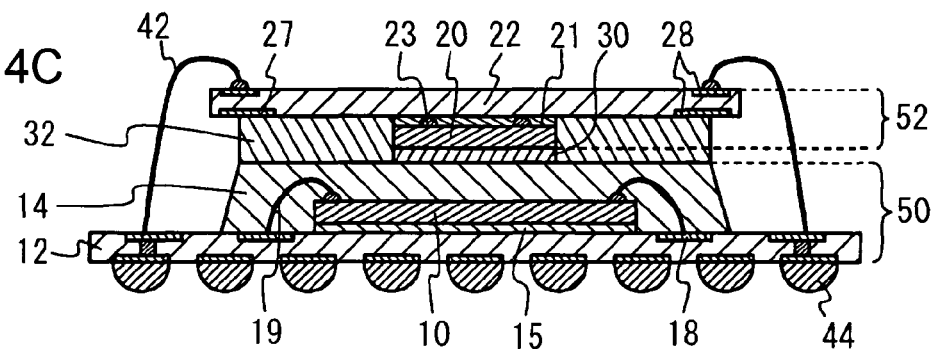
Figure 4D:
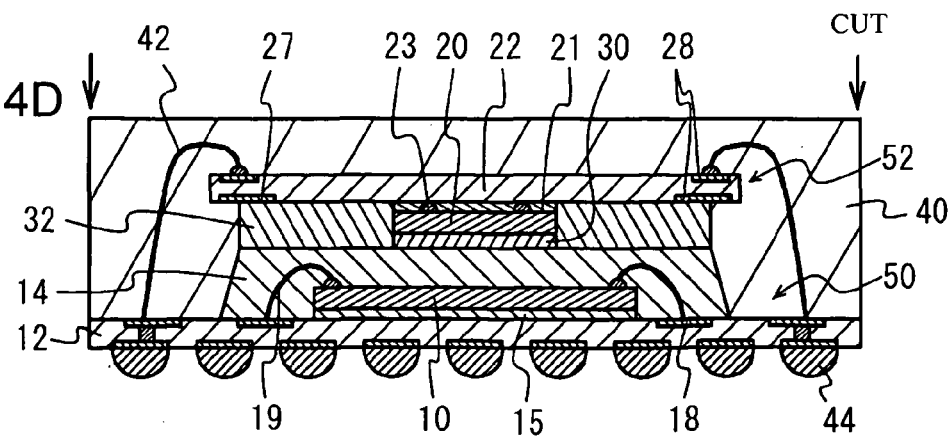

With reference to FIG. 4C, the first substrate electrode 18 and the second substrate electrode 28 are coupled to each other by the second wire 42. With reference to FIG. 4D, the second molding resin 40 is formed on the upper surface of the first interposer 12. Further, the external coupling terminal 44 is formed, and cutting is preformed at a predetermined position. Processes in FIG. 4C and later are the same as those in the first embodiment. According to the above processes, the semiconductor device 101 of the second embodiment is completed.

Figure 5:
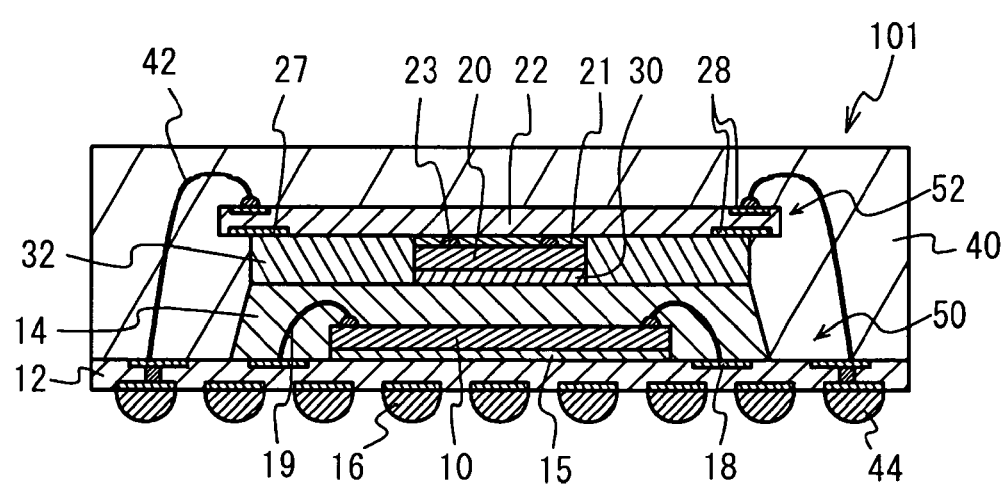
FIG. 5 is a cross-sectional view of the semiconductor device according to the second embodiment.

FIG. 5 shows a structure of the semiconductor device 101 according to the second embodiment. Compared to the second interposer 22 and the first molding resin 14, the second semiconductor chip 20 is smaller when seen in a vertical direction. In the area between the first molding resin 14 and the second interposer 22, the supporting member 32 is provided. Other structures are the same as those in the first embodiment (FIG. 3).

With reference to FIG. 2D, in the first embodiment, the space between the first molding resin 14 and the second interposer 22 is filled with the second molding resin 40. Accordingly, in a case where such space is small, or in a case where the length of the second interposer 22 projecting from the second semiconductor chip 20 (overhanging amount) is large, the second molding resin 40 does not reach the innermost part, and unfilled portions or voids is generated in some cases. With reference to FIG. 4D, as for the semiconductor device 101 according to the second embodiment, the space between the first molding resin 14 and the second interposer 22 is filled with the supporting member 32. Therefore, it is unnecessary to form the second molding resin 40 in such space. Accordingly, generation of unfilled portions or voids in the second molding resin 40 can be prevented.

In the case where the overhanging amount of the second interposer 22 is large, the second interposer 22 is prone to bend, and thermal conductivity decreases. Therefore, it is difficult to perform stable wire bonding. With reference to FIG. 4C, in the second embodiment, since the space between the first molding resin 14 and the second interposer 22 is filled with the supporting member 32, thermal conductivity to the second interposer 22 can be improved. Further, by enhancing the mechanical strength of the second interposer 22, occurrence of bending due to a pressure of a wire-bonding tool can be prevented. Accordingly, stability of wire bonding can be improved, and reliability of connectivity between the second substrate electrode 28 and the second wire 42 can be improved.

Figure 6:
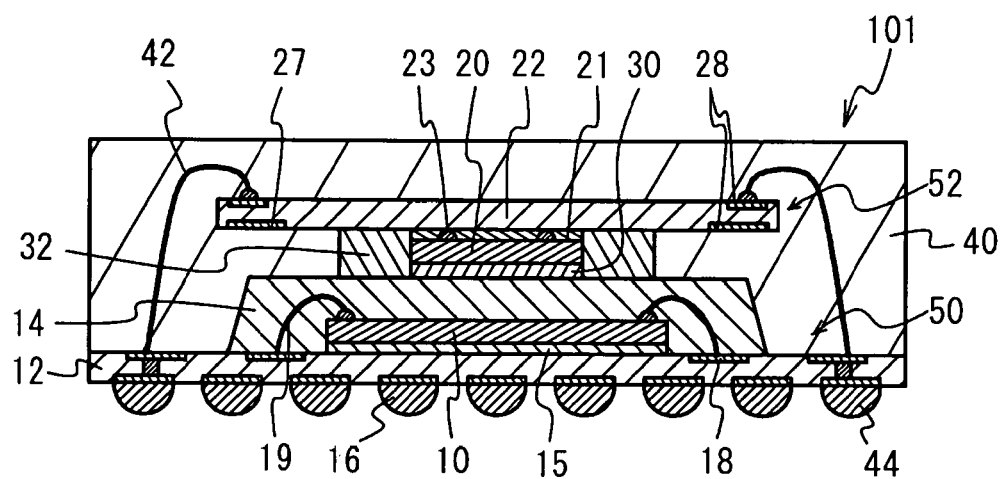
FIG. 6 is a cross-sectional view of an alternative semiconductor device according to the second embodiment.

With reference to FIG. 6, although it is enough to provide the supporting member 32 so as to cover at least the side surfaces of the second semiconductor chip 20, it is preferable to provide the supporting member 32 throughout the area between the first molding resin 14 and the second interposer 22 as shown in FIG. 5. Accordingly, stability of wire bonding can be further improved, and reliability of connectivity between the second substrate electrode 28 and the second wire 42 can be further improved.

A third embodiment of the present invention is an example of a case where an adhesive also serves as a supporting member. With reference to FIG. 7A to FIG. 7D, a method for manufacturing a semiconductor device 102 according to the third embodiment will be explained. Note that the same numerals are used for the same structures as those of the method for manufacturing the semiconductor device 100 according to the first embodiment (FIG. 2A to FIG. 2D), and their explanations are omitted.

Figure 7A:
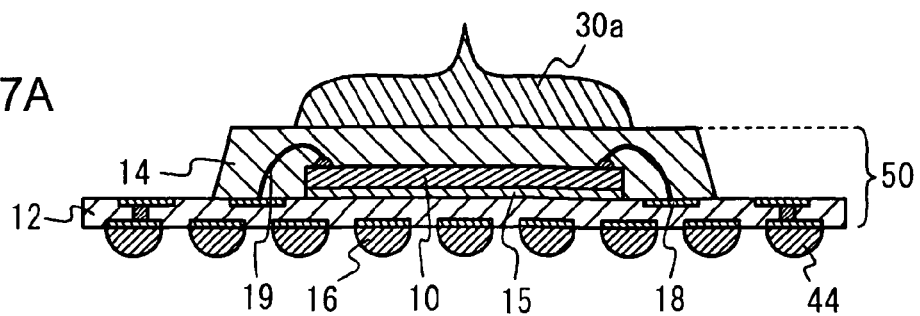
FIG. 7A to FIG. 7D show a method for manufacturing a semiconductor device according to a third embodiment of the present invention.

With reference to FIG. 7A, an adhesive 30a is provided on the upper surface of the first molding resin 14. Since the adhesive 30a also serves the role of the supporting member of the second embodiment, an adequate amount of the adhesive 30a is provided so as to fill the area between the first molding resin 14 and the second interposer 22.

Figure 7B:
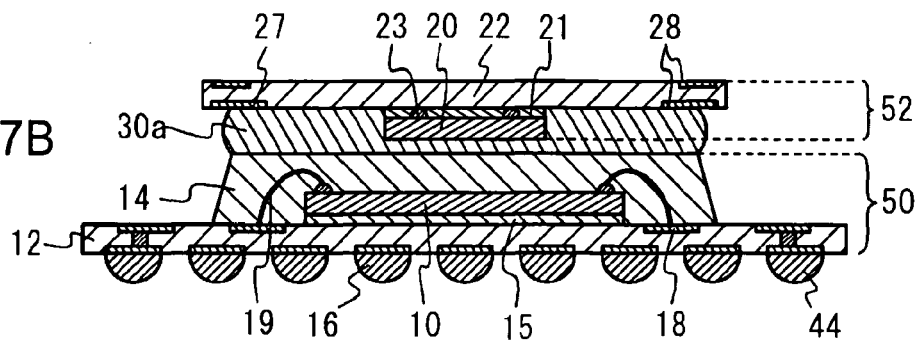

With reference to FIG. 7B, the second semiconductor chip 20 of the second semiconductor package 52 is mounted on the upper surface of the first molding resin 14 via the adhesive 30a. Here, the second semiconductor chip 20 is further pressed after causing the second semiconductor chip 20 to contact the adhesive 30a, to fill the area between the first molding resin 14 and the second interposer 22 with the adhesive 30a. Although it is enough to fill the area with the adhesive 30a so as to cover at least the side surfaces of the second semiconductor chip 20, it is preferable to fill the area between the first molding resin 14 and the second interposer 22 thoroughly with the adhesive 30a as shown in FIG. 7B.

Figure 7C:
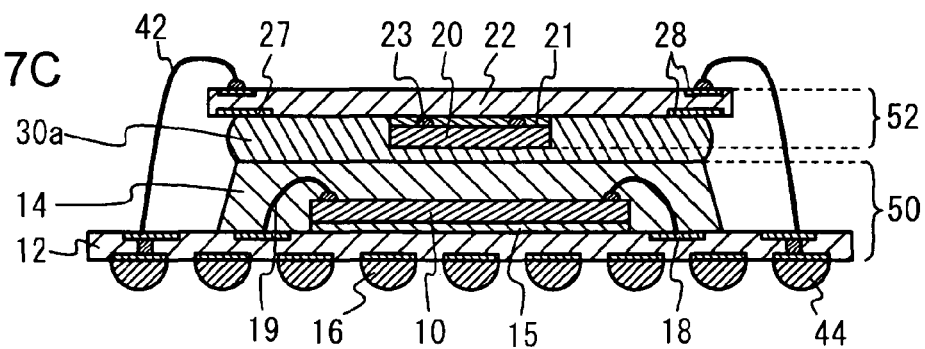
Figure 7D:
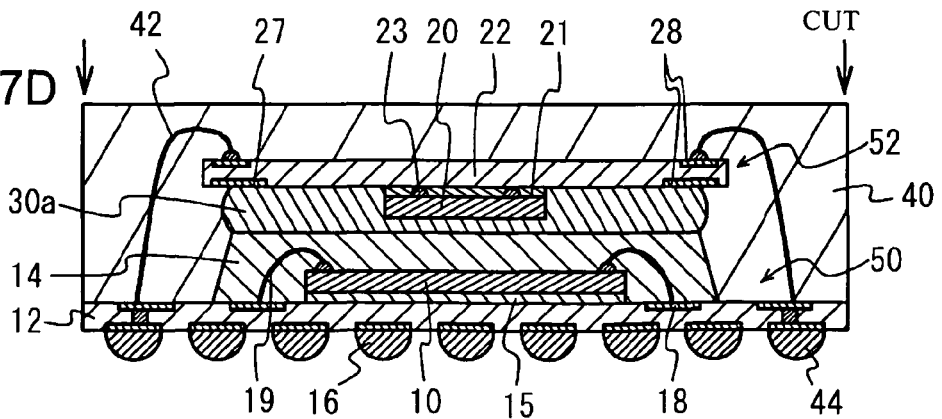

With reference to FIG. 7C, the first substrate electrode 18 and the second substrate electrode 28 are coupled to each other by the second wire 42. With reference to FIG. 7D, the second molding resin 40 is formed on the upper surface of the first interposer 12. Further, the external coupling terminal 44 is formed, and cutting is performed at a predetermined position. Processes in FIG. 7C and later are the same as those in the first embodiment. According to the above processes, the semiconductor device 102 according to the third embodiment is completed.

Figure 8:
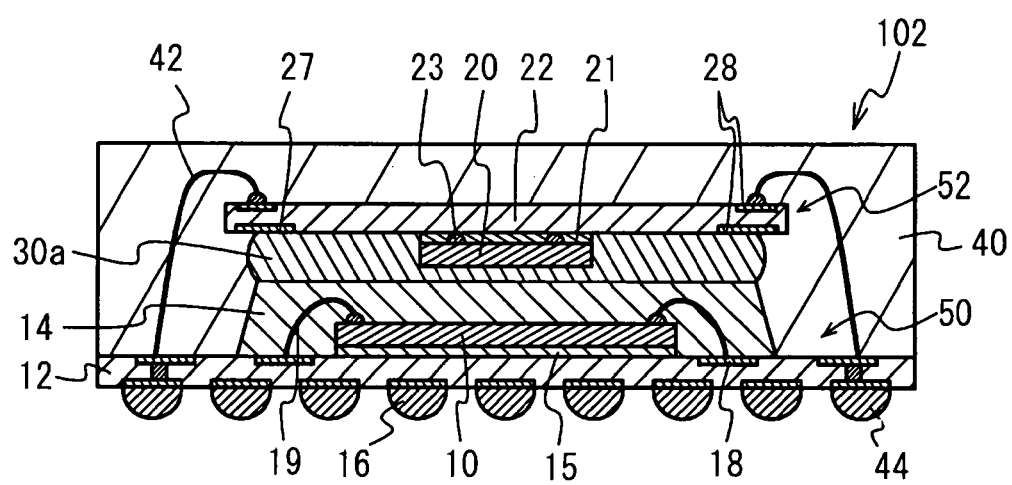
FIG. 8 is a cross-sectional view of the semiconductor device according to the third embodiment.

FIG. 8 shows a structure of the semiconductor device 102 according to the third embodiment. On the upper surface of the first molding resin 14, the second semiconductor chip 20 is mounted via the adhesive 30a. The adhesive 30a is also provided in the area between the first molding resin 14 and the second interposer 22. Other structures are the same as those in the first embodiment (FIG. 3).

As for the semiconductor device 102 according to the third embodiment, the adhesive 30a is provided in the area between the first molding resin 14 and the second interposer 22. Accordingly, since the adhesive 30a serves the same role as that of the supporting member 32 of the second embodiment, generation of unfilled portions or voids in the second molding resin 40 can be prevented in a similar way to in the second embodiment. Further, stability of wire bonding in FIG. 7C can be improved, and reliability of connectivity between the second substrate electrode 28 and the second wire 42 can be improved.

Further, in the third embodiment, since the adhesive 30a also serves as the role of the supporting member 32 of the second embodiment, it is unnecessary to newly provide the supporting member 32. Accordingly, it is possible to reduce the number of members, and simplify the manufacturing process.

Figure 9:
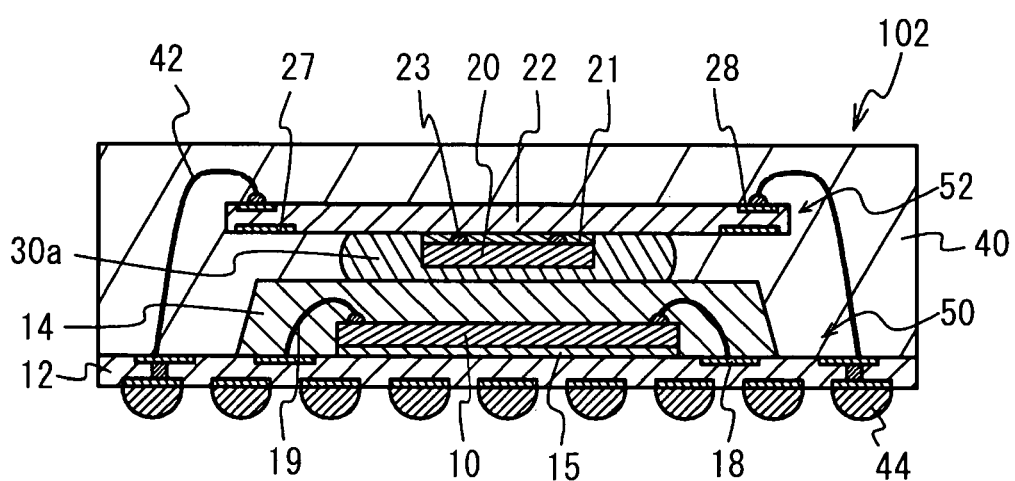
FIG. 9 is a cross-sectional view of an alternative semiconductor device according to the third embodiment.

As shown in FIG. 9, although it is enough to provide the adhesive 30a so as to cover at least the side surfaces of the second semiconductor chip 20, it is preferable to provide the adhesive 30a throughout the area between the first molding resin 14 and the second interposer 22 as shown in FIG. 8. Side surfaces of the adhesive 30a may be distorted by the pressure when pressed, and further, a portion thereof may be protruded from side surfaces of the first molding resin 14. For the adhesive 30a, although an epoxy based resin, an acrylic based resin, or a silicone based resin may be used, it is preferable to use a silicone based resin having high thermal conductivity.

A fourth embodiment of the present invention is an example of using a second interposer on which a plurality of second semiconductor chips are mounted as a second semiconductor package.

Figure 10:
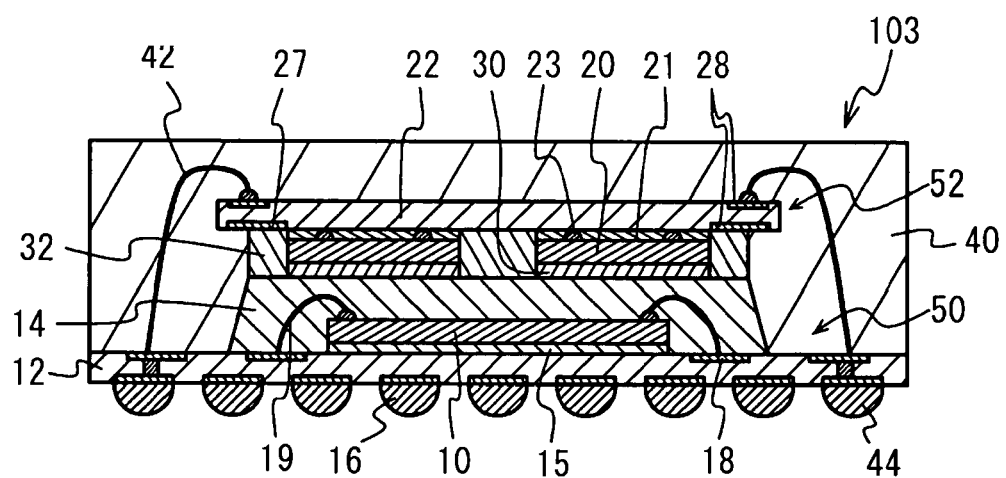
FIG. 10 is a cross-sectional view of a semiconductor device according to a fourth embodiment of the present invention.

FIG. 10 shows a structure of a semiconductor device 103 according to the fourth embodiment. Two second semiconductor chips 20 are mounted on the second interposer 22. The two second semiconductor chips 20 are respectively mounted on the second interposer 22 by flip-chip bonding, and are mounted on the upper surface of the first molding resin 14 via the adhesive 30. In an area where the second semiconductor chip 20 is not provided in the area between the first molding resin 14 and the second interposer 20, the supporting member 32 is provided. Other structures are the same as those in the first embodiment (FIG. 3).

Figure 11:
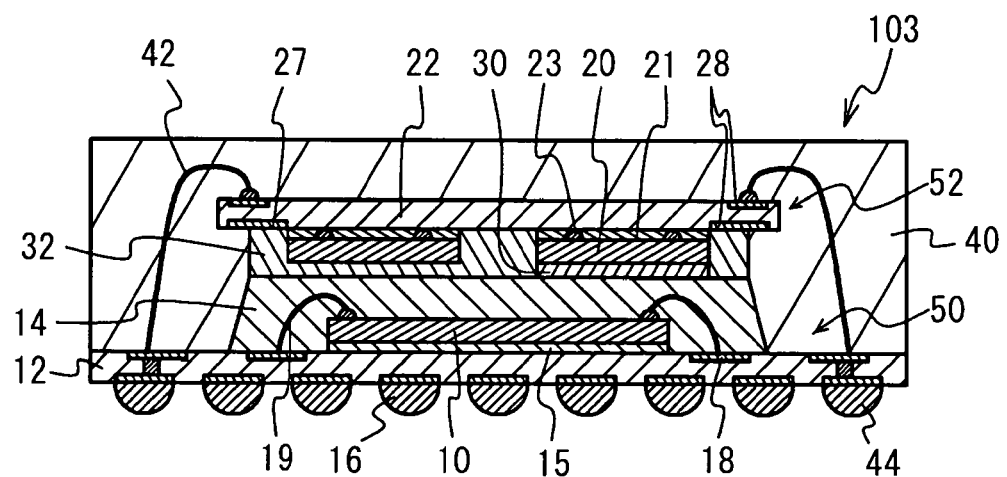
FIG. 11 is a cross-sectional view of an alternative semiconductor device according to the fourth embodiment.

The number of second semiconductor chips 20 to be mounted on the second interposer 22 may be three or more as long as they are provided in a plurality. It is enough to mount at least one of the plurality of second semiconductor chips 20 on the upper surface of the first molding resin 14 via the adhesive 30 as shown in FIG. 11. As described above, the second interposer 22 on which the plurality of second semiconductor chips 20 are mounted can be used as the second semiconductor package 52.

Further, even in a case where some of the plurality of second semiconductor chips 20 are not directly mounted on the upper surface of the first molding resin 14 via the adhesive 30 as shown in FIG. 11, the second semiconductor chips 20 and the second interposer 22 can be supported stably by the supporting member 32 provided between the first molding resin 14 and the second interposer 22. As for the supporting member 32, a structure in which the adhesive 30a serves also as the supporting member 32 as in the third embodiment may be adopted.

Several aspects of the present invention are summarized below.

According to an aspect of the present invention, there is provided a semiconductor device according to a first aspect of the present invention includes: a first semiconductor chip; a first interposer having an upper surface on which the first semiconductor chip is mounted; a first molding resin, provided on the upper surface of the first interposer, which seals the first semiconductor chip; a second semiconductor chip mounted on an upper surface of the first molding resin; a second interposer on which the second semiconductor chip is mounted by flip chip bonding; and a second molding resin, provided on the upper surface of the first interposer, which seals the first molding resin, the second semiconductor chip, and the second interposer. In the semiconductor device, the second semiconductor chip is mounted, with a surface thereof opposite to another surface mounted on the second interposer faced down, on the upper surface of the first molding resin via an adhesive. According to this aspect of the present invention, the second semiconductor chip mounted on the second interposer by flip-chip bonding is directly mounted on the upper surface of the first molding resin via the adhesive. Therefore, compared to the case of mounting a resin-sealed second semiconductor chip, the semiconductor device can be low-profiled. Also, adhesiveness between members can be improved.

The semiconductor device may also include a supporting member provided in an area between the first molding resin and the second interposer so as to cover at least side surfaces of the second semiconductor chip. With this arrangement, generation of unfilled portions or voids in the second molding resin can be prevented, and connectivity of a second substrate electrode and a second wire can be improved. Furthermore, the supporting member may be provided throughout the area between the first molding resin and the second interposer. With this arrangement, generation of unfilled portions or voids in the second molding resin can be further prevented, and connectivity of the second substrate electrode and the second wire can be further improved. The adhesive may be provided in an area between the first molding resin and the second interposer so as to cover at least side surfaces of the second semiconductor chip. With this arrangement, generation of unfilled portions or voids in the second molding resin can be prevented, and connectivity of the second substrate electrode and the second wire can be improved. Also, the number of members can be reduced compared to the case of using the supporting member.

In one embodiment, the adhesive may be provided throughout the area between the first molding resin and the second interposer. With this arrangement, generation of unfilled portions or voids in the second molding resin can be further prevented, and connectivity of the second substrate electrode and the second wire can be further improved. The semiconductor device may further include a testing electrode provided on a surface, of the second interposer, on which the second semiconductor chip is mounted. With this arrangement, since selectivity of a position to provide the testing electrode is improved, the degree of freedom in design can be increased. Moreover, the second semiconductor chip may be mounted plurally on the second interposer. At least one of the plurality of second semiconductor chips may be mounted on the upper surface of the first molding resin via the adhesive.

According to another aspect of the present invention, there is provided a method for manufacturing a semiconductor device according to a second aspect of the present invention includes the steps of: mounting via an adhesive a second semiconductor chip mounted on a second interposer by flip-chip bonding, by facing down a surface thereof opposite to another surface mounted on the second interposer, on an upper surface of a first molding resin that seals a first semiconductor chip mounted on an upper surface of a first interposer; and forming, on the upper surface of the first interposer, a second molding resin that seals the first molding resin, the second semiconductor chip, and the second interposer. According to this aspect of the present invention, the second semiconductor chip mounted on the second interposer by flip-chip bonding can be directly mounted on the upper surface of the first molding resin via the adhesive. Therefore, compared to the case of mounting a resin-sealed second semiconductor chip, the semiconductor device can be low-profiled. Also, adhesiveness between members when forming the second molding resin can be improved.

In the above-described method, the step of mounting the second semiconductor chip on the upper surface of the first molding resin via the adhesive may also include the steps of: providing the adhesive on the upper surface of the first molding resin; and filling an area between the first molding resin and the second interposer with the adhesive by causing the second semiconductor chip to contact the adhesive and thereafter pressing the second semiconductor chip. With this method, generation of unfilled portions or voids when forming the second molding resin can be prevented. Also, stability when wire bonding the second wire can be improved. Further, the number of members can be reduced compared to the case of filling a supporting member separately.

It should be noted that the step of filling the area between the first molding resin and the second interposer with the adhesive may fill the area between the first molding resin and the second interposer thoroughly with the adhesive. With this method, generation of unfilled portions or voids when forming the second molding resin can be further prevented. Also, stability when wire bonding the second wire can be further improved.

The above-described method may also include the step of filling an area between the first molding resin and the second interposer with a supporting member so as to cover at least side surfaces of the second semiconductor chip after the step of mounting the second semiconductor chip on the upper surface of the first molding resin via the adhesive. With this method, generation of unfilled portions or voids when forming the second molding resin can be prevented. Also, stability when wire bonding the second wire can be improved. The step of filling the area between the first molding resin and the second interposer with the supporting member may fill the area between the first molding resin and the second interposer thoroughly with the supporting member. With this method, generation of unfilled portions or voids when forming the second molding resin can be further prevented. Also, stability when wire bonding the second wire can be further improved.

The step of mounting the second semiconductor chip on the upper surface of the first molding resin via the adhesive may mount at least one of the plurality of second semiconductor chips mounted on the second interposer, by facing down a surface thereof opposite to another surface mounted on the second interposer, on the upper surface of the first molding resin via the adhesive. With this method, even in a case where the second semiconductor chip is mounted in a plurality on the second interposer, the second semiconductor chip can be mounted on the upper surface of the first molding resin.

According to some embodiments of the present invention, the second semiconductor chip mounted on the second interposer by flip-chip bonding is directly mounted on the upper surface of the first molding resin via the adhesive. Accordingly, compared to the case of mounting a resin-sealed second semiconductor chip, the semiconductor device can be low-profiled. Also, adhesiveness between members can be improved.

While the preferred embodiments of the present invention have been described in detail above, the present invention is not limited to those specific embodiments and, within the spirit and scope of the present invention as defined in the appended claims, various modifications and alterations may be made.

I claim:

1. A method for manufacturing a semiconductor device, comprising the steps of:
   mounting via an adhesive, a second semiconductor chip of a second semiconductor package on an upper surface of a first molding resin of a first semiconductor package, the second semiconductor chip being mounted to a second interposer of the second semiconductor package by flip-chip bonding, wherein the adhesive is provided directly on the second semiconductor chip;
   sealing an area between the first molding resin and the second interposer by filling the area between the first molding resin and the second interposer with a supporting member so as to cover side surfaces of the second semiconductor chip; and
   forming, on an upper surface of a first interposer comprised in the first semiconductor package, a second molding resin that surrounds and seals the first molding resin, which surrounds and seals a first semiconductor chip of the first semiconductor package, and surrounds and seals side surfaces of the supporting member that covers the side surfaces of the second semiconductor package.

2. The method for manufacturing the semiconductor device according to claim 1, wherein the step of directly mounting the second semiconductor chip on the upper surface of the first molding resin via the adhesive comprises the steps of:
   providing the adhesive on the upper surface of the first molding resin; and
   causing the second semiconductor chip to contact the adhesive and thereafter pressing the second semiconductor package.

3. The method for manufacturing the semiconductor device according to claim 1 wherein the supporting member is provided in the area between the first molding resin and the second interposer so as to cover the side surfaces of the second semiconductor chip and a surface of a third semiconductor chip of the second semiconductor package, opposite to another surface mounted on the second interposer and so as to cover side surfaces of the third semiconductor chip of the second semiconductor package.

4. The method for manufacturing the semiconductor device according to claim 1, wherein a length of the second semiconductor chip is shorter than a length of the upper surface of the first molding resign in a lateral direction.

5. The method for manufacturing the semiconductor device according to claim 1, wherein a length of the second semiconductor chip is shorter than a length of the second interposer in a lateral direction.

* * * * *